(12) United States Patent
Uchida

(10) Patent No.: US 7,385,233 B2
(45) Date of Patent: Jun. 10, 2008

(54) GATE ARRAY INTEGRATED CIRCUIT INCLUDING A UNIT CELL BASIC LAYER HAVING GATE TERMINAL REGIONS ALLOWING TWO CONTACT PADS TO BE DISPOSED LATERALLY

(75) Inventor: Hirofumi Uchida, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 90 days.

(21) Appl. No.: 11/220,657

(22) Filed: Sep. 8, 2005

(65) Prior Publication Data

US 2006/0060889 A1 Mar. 23, 2006

(30) Foreign Application Priority Data

Sep. 17, 2004 (JP) .............................. 2004-271662

(51) Int. Cl.
*H01L 27/10* (2006.01)
(52) U.S. Cl. ...................... 257/206; 257/211; 257/208; 257/202
(58) Field of Classification Search ................ 257/206, 257/211, 208, 202
See application file for complete search history.

(56) References Cited

U.S. PATENT DOCUMENTS

| | | | | |
|---|---|---|---|---|
| 5,079,614 | A | * | 1/1992 | Khatakhotan ................ 257/369 |
| 5,764,533 | A | * | 6/1998 | deDood ......................... 716/8 |
| 2006/0043422 | A1 | * | 3/2006 | Chen et al. ................. 257/202 |

FOREIGN PATENT DOCUMENTS

| | | |
|---|---|---|
| JP | 07-307447 | 11/1995 |
| JP | 08-008441 | 1/1996 |
| JP | 08-321559 | 12/1996 |

\* cited by examiner

*Primary Examiner*—Kevin M. Picardat
*Assistant Examiner*—Neil Prasad
(74) *Attorney, Agent, or Firm*—Rabin & Berdo, PC

(57) ABSTRACT

A gate array integrated circuit forming part of a semiconductor integrated circuit includes a basic layer of a unit cell in which a PMOS and an NMOS transistor are connected with a poly-silicon strip. The poly-silicon strip has gate terminal regions formed to laterally extend to allow two or more contact pads or through-holes to be disposed in each gate terminal region. It is thus possible to improve wiring efficiency and also micro-miniaturization and yield of the gate array integrated circuit. A layout method for a gate array integrated circuit is also provided.

16 Claims, 12 Drawing Sheets

GATE ARRAY INTEGRATED CIRCUIT INCLUDING A UNIT CELL BASIC LAYER HAVING GATE TERMINAL REGIONS ALLOWING TWO CONTACT PADS TO BE DISPOSED LATERALLY

BACKGROUND FOR THE INVENTION

1. Field of the Invention

The invention relates to a gate array integrated circuit, forming part of a semiconductor integrated circuit, and a layout method for a gate array integrated circuit.

2. Description of the Background Art

Traditionally, a gate array is composed of basic functional cells, such as inverters and flip-flops. A basic functional cell is implemented by optionally designing the wiring pattern layer of a unit cell. As shown in FIG. 11, for example, a specific layout of a unit cell 400 is defined by a basic layer which has a p-type metal-oxide-semiconductor (PMOS) transistor 402 and an n-type metal-oxide-semiconductor (NMOS) transistor 404 interconnected to each other by strips of poly-crystalline silicon 406 and 408. The PMOS transistor 402 may consist of an n-type well 410, a p-type implantation layer 412, an active region 414 and a p-type layer 416 The NMOS transistor 404 may consist of a p-type implantation layer 418, an active region 420 and an n-type layer 422.

The basic layer of the unit cell 400 is overlaid with an upper wiring pattern layer which includes, e.g. contact pads 434 and a first layer of metal strips 436, etc., FIG. 12, to form the wiring layer, a dual-input NAND gate 430 being thus laid out to serve as a basic functional cell.

Usually, a unit cell conveys information on terminals functioning as nodes for connecting basic functional cells with each other. Specifically, the dual-input NAND gate 430 has plural gate terminals 432. In order to optimize the size of the cells, each of the plural gate terminal regions 432 has its size suitable for accommodating therein the single contact pad 434 or a single through-hole for connecting transistors or basic functional cells. Further, as seen from FIG. 12, desired ones of the plural gate terminal regions 432 are provided with input terminals a and b, and the first layer of metal strips 436 has an output terminal yn provided at a desired position.

Japanese patent laid-open publication No. 321559/1996 discloses a polycide gate electrode structure formed in a hook-like shape in a unit cell of static random-access memory (SRAM). In the structure, the polycide wiring pad for contact with wiring metal and the polycide wiring strip to the branching point of the polycide gate are of n-type polycide. It is thus possible to suppress the variety of the threshold, Vth, of the n-channel transistor caused by boron, B, diffused in the lateral direction in the dual polycide gate electrode region.

Further, Japanese patent laid-open publication No. 8441/1996 discloses a dual gate type of field effect transistor, in which the first gate electrode has plural power-fed points and the second gate electrode has a single power-fed point, so that the first gate electrode is of a comb-like gate structure and the second gate electrode not of a comb-like gate structure. That makes it possible not to lay out the second gate and drain electrodes, across which the highest voltage is applied while the transistor is operative, so as not to cross each other.

Furthermore, Japanese patent laid-open publication No. 307447/1995 discloses as a technology of a basic cell for a gate cell a semiconductor device having its gate electrode turning and a semiconductor device having its gate electrode rectangularly turning several times.

For manufacturing gate arrays, improvement is always required in micro-miniaturization and yield. With the conventional gate arrays as well as the Japanese patent publications described above, however, each of the gate electrode regions has its contact pad or through-hole disposed in single sit. That made it difficult to accomplish the improvement as required in micro-miniaturization and yield.

SUMMARY OF THE INVENTION

It is an object of the present invention to provide a gate array integrated circuit forming part of a semiconductor integrated circuit with its wiring efficiency increased and micro-miniaturization and yield improved. It is also an object of the present invention to provide such a layout method for such a gate array integrated circuit.

According to the invention, a gate array integrated circuit comprises at least one unit cell having a poly-silicon layer laminated. Said poly-silicon layer has a plurality of gate terminal regions formed for disposing a wiring terminal such as an input or output terminal. Said plurality of gate terminal regions are elongated in a lateral direction to allow a plurality of connecting parts such as a contact pad or a through-hole to be arrayed in the lateral direction.

Also in accordance with the invention, in a layout method of designing a gate array integrated circuit including at least one unit cell having a poly-silicon layer laminated, a plurality of gate terminal regions are formed in the poly-silicon layer for disposing a wiring terminal such as an input or output terminal. Said plurality of gate terminal regions are elongated in a lateral direction to allow a plurality of connecting parts such as a contact pad or a through-hole to be arrayed in the lateral direction in each of said plurality of gate terminal regions.

A gate array integrated circuit according to the invention includes a basic layer of a unit cell having a poly-silicon layer laminated and having a plurality of gate terminal regions extending in a lateral direction, thus allowing a plurality of contact pads and/or through-holes laterally in each gate terminal region. Further, in the basic layer of the unit cell, the poly-silicon layer has portions arranged in parallel to each other. The plurality of gate terminal regions are arranged in a comb-like shape with its teeth alternately interposed between the two portions of the poly-silicon lines, thus enhancing freedom in laying out terminals such as input and output terminals. It is therefore possible to improve wiring efficiency in designing basic functional cells, and reduce the man hour required for assembling basic functional cells. In addition, dimensions of basic functional cells proper will also successfully be miniaturized.

Further, in a gate array integrated circuit according to the invention, a unit cell includes a basic layer having a plurality of gate terminal regions extending not only laterally but also vertically, thus making it possible to increase freedom in disposing terminals also in the vertical direction. It is thus possible to avoid the design rules for, e.g. marginal overlapping of the first metal layer, from being violated, and increase wiring efficiency in designing basic functional cells.

Further, in a gate array integrated circuit according to the invention, a unit cell includes a basic layer having a plurality of gate terminal regions extending laterally and vertically and having a notch formed at a portion not to be used in common to a plurality of unit cells contained in the gate array integrated circuit. That renders it possible to reduce the poly-silicon wiring area of gate terminals to reduce the capacitance thereof, thus resulting in improvement in processing speed and power saving.

BRIEF DESCRIPTION OF THE DRAWINGS

The objects and features of the present invention will become more apparent from consideration of the following detailed description taken in conjunction with the accompanying drawings in which.

DESCRIPTION OF PREFERRED EMBODIMENTS

Figure 1:
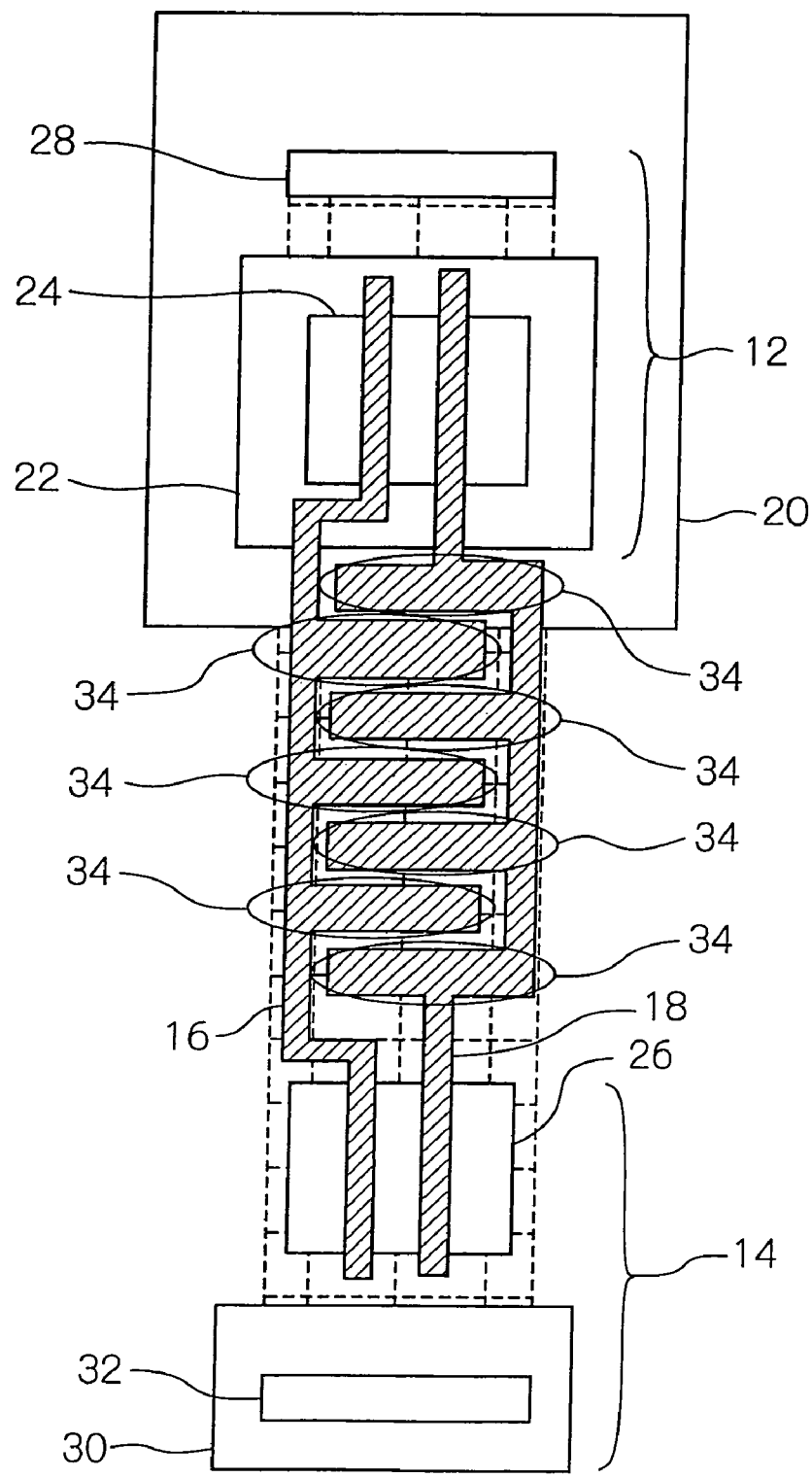
FIG. 1 is a schematic plan view that shows an embodiment of the basic layer of a unit cell contained in a gate array according to the invention.
Figure 2:
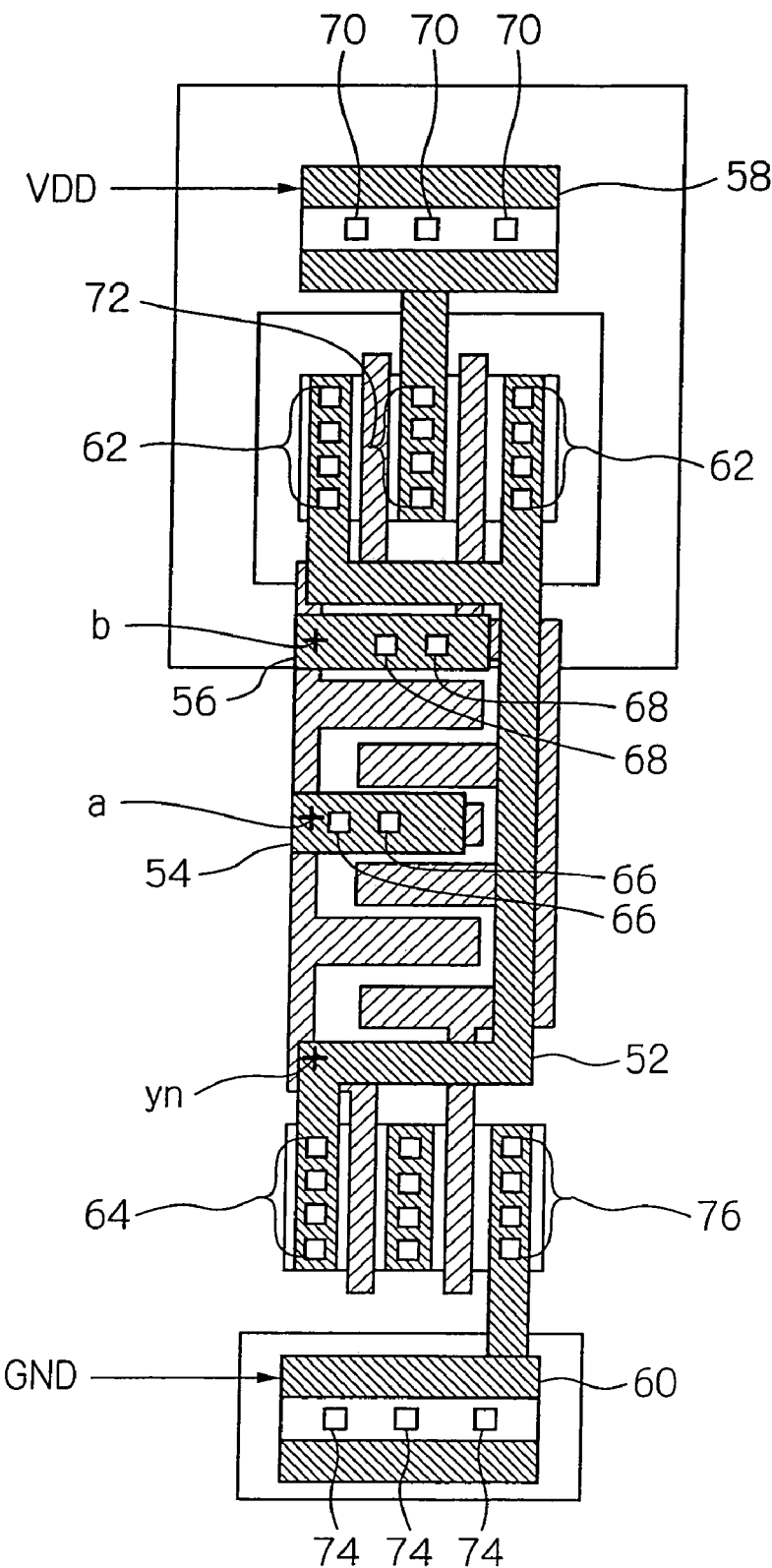
FIG. 2 is also a schematic plan view that shows an embodiment of a NAND gate circuit which is implemented by applying the basic layer of the unit cell shown in FIG. 1.

In the following, the preferred embodiments of the gate array according to the invention will be described in detail with reference to the accompanying drawings. As shown in FIG. 1, the illustrative embodiment of the gate array according to the invention comprises a gate array basic layer forming a unit cell 10 including a PMOS transistor 12 and an NMOS transistor 14, for example, which are interconnected with each other, as shown in FIG. 2, with a first layer of metal strips 52, 54, 56, 58 and 60 laid thereover by means of contact pads 62, 64, 66, 68, 70, 72, 74 and 76. Parts or elements not directly pertinent to understanding of the invention are not shown and redundant description is omitted for simplification.

In the embodiment, the basic layer of the unit cell 10 may be fabricated on a p-type substrate, for example, the substrate being not specifically designated with a reference numeral. The PMOS transistor 12 is formed in an n-type well 20 provided on the p-type substrate, and includes a p-type implantation layer 22 deposited thereover and functioning as an active region 24. The NMOS transistor 14 includes an active region 26 formed on the p-type substrate. The PMOS transistor 12 also has a p-type layer 28 provided on the n-type well 20 to serve as an active region. The NMOS transistor 14 has an n-type layer 32 provided on a p-type implantation layer 30, deposited on the p-type substrate, to function as an active region.

On the structure, poly-crystalline silicon portions, specifically strips, 16 and 18 are arranged to bridge the active regions 24 and 26 of the PMOS and NMOS transistors 12 and 14. The poly-silicon strips 16 and 18 include plural gate terminal regions 34, which are, specifically with the embodiment, so extended laterally in the figure as to have the length thereof sufficient for disposing two or more contact pads or through-holes along the length thereof. Stated in another way, the plurality of gate terminal regions 34 are elongated in a direction substantially perpendicular to the longitudinal direction of the poly-silicon strips 16 and 18, thus permitting two or more contact pads or through-holes to be arrayed along the length of the regions 34. In the embodiment, the one poly-silicon strip 16 is provided with three gate terminal regions 34, and the other poly-silicon strip 18 is provided with four gate terminal regions 34. The one set of terminal regions 34 is alternately interposed between the other set of gate terminal regions 34 to form comb-like structure, as depicted in the figure. However, both poly-silicon strips 16 and 18 may not be restricted to that specific structure, but include a desired number of gate terminal regions 34. They may not be arranged in such an alternate manner.

Figure 3:
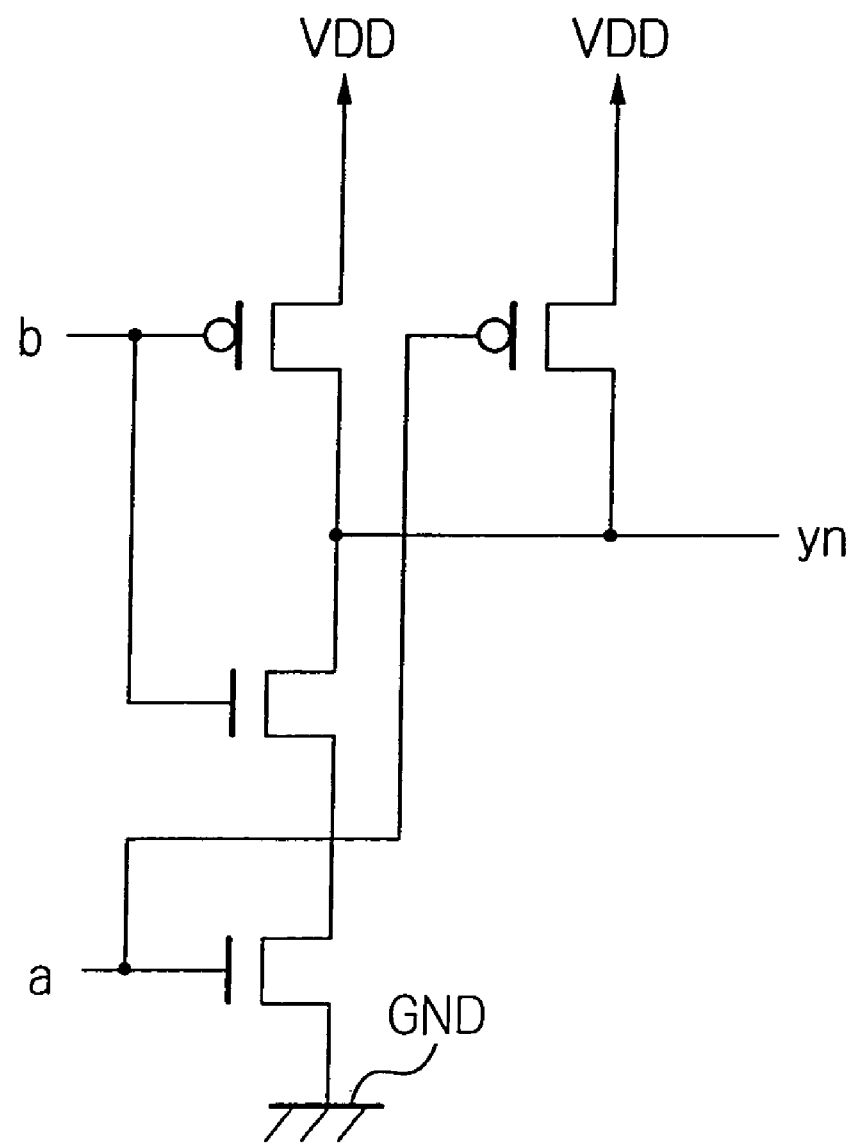
FIG. 3 is a schematic circuit diagram of the NAND gate circuit shown in FIG. 2.

With the gate array of the embodiment, the basic layer of the unit cell 10 is overlaid with the upper wiring layer of the first metal strips, etc., as shown in FIG. 2, with the contact pads jointed to specifically implement a dual-input single-output NAND gate circuit 50. The NAND gate circuit 50 may be what is schematically shown in a circuit diagram of FIG. 3.

The NAND gate circuit 50 has a portion, specifically strip, 52 of the first metal layer arranged to bridge the active region 24 of the PMOS transistor 12 and the active region 26 of the NMOS transistor 14. The strip 52 of the first metal layer is connected to the active region 24 by means of plural contact pads 62 and to the active region 26 by means of plural contact pads 64.

Further, the NAND gate circuit 50 has strips 54 and 56 of the first metal layer arranged on desired ones of the plural gate terminal regions in which input terminals a and b are to be arranged. With the embodiment, the strips 54 and 56 of the first metal layer can extend laterally in the figure since the gate terminal regions extended laterally. The strips 54 and 56 of the first metal layer have plural contact pads 66 and 68, respectively, arranged to be connected to the poly-silicon strips 16 and 18.

In the embodiment, the input terminal a is located on a laterally elongate strip 54 of the first metal layer, and the input terminal b is on another laterally elongate strip 56 of the first metal layer. The output terminal yn is located on the strip 52 of the first metal layer bridging the PMOS and NMOS transistors 12 and 14.

In the embodiment, the strips 54 and 56 of the first metal layer are thus extended laterally in FIG. 2, i.e. in the direction substantially perpendicular to the longitudinal direction of the strip 52 of the first metal layer. That allows the input terminals a and b to be disposed with the freedom in position extended over the entire length of the strips 54 and 56 of the first metal layer. Further, the plural gate terminal regions are thus arranged alternately between the teeth of the comb-like shapes. That increases the gate terminal regions available to arranging the strips 54 and 56 of the first metal layer thereon. Furthermore, the output terminal yn can be disposed on the section of the strip 52 of the first metal layer between PMOS transistor 12 and NMOS transistor 14. Design freedom is thus improved in laying out input and output terminals, and wiring efficiency is also improved for designing basic functional cells. It is therefore possible to reduce the man-hour required for designing basic functional cells. In addition, it is also possible to miniaturize in dimension basic functional cells proper.

The NAND gate circuit 50 has, as shown in FIG. 2, the strips 58 and 60 of the first metal layer arranged at the positions respectively corresponding to those of the p-type region 28 and n-type region 32 shown in FIG. 1. In the embodiment, the strip 58 of the first metal is prepared for connecting a voltage source VDD. The strip 58 of the first metal is connected to the p-type region 28 by means of the contact pad 70 and to the active region 24 by means of the contact pad 72. The strip 60 of the first metal layer is prepared for connecting a reference voltage such as ground GND. The strip 60 of the first metal layer is connected to the n-type region 32 by means of the contact pad 74 and to the active region 26 by means of the contact pad 76.

Next, an alternative embodiment of the gate array according to the invention will be described. The basic layer of a unit cell 200 has poly-silicon strips 202 and 204, which have gate terminal regions 206 extending not only laterally in the figure but also longitudinally, i.e. in the longitudinal direction of the strips 202 and 204. The gate terminal regions 202 and 204 may have dimension to dispose, for example, two or more contact pads or through-holes thereon. In the embodiment, the one poly-silicon strip 202 is provided with the single gate terminal region 206, and the other poly-silicon strip 204 is provided with two gate terminal regions 206. Those gate terminal regions have a comb-like shape with the teeth thereof interposing alternately with each other. However, both poly-silicon strips 202 and 204 may not be restricted to that specific structure, but include a desired number of gate terminal regions 206. They may be arranged in a comb-like shape other than the alternately interposing teeth.

Figure 5:
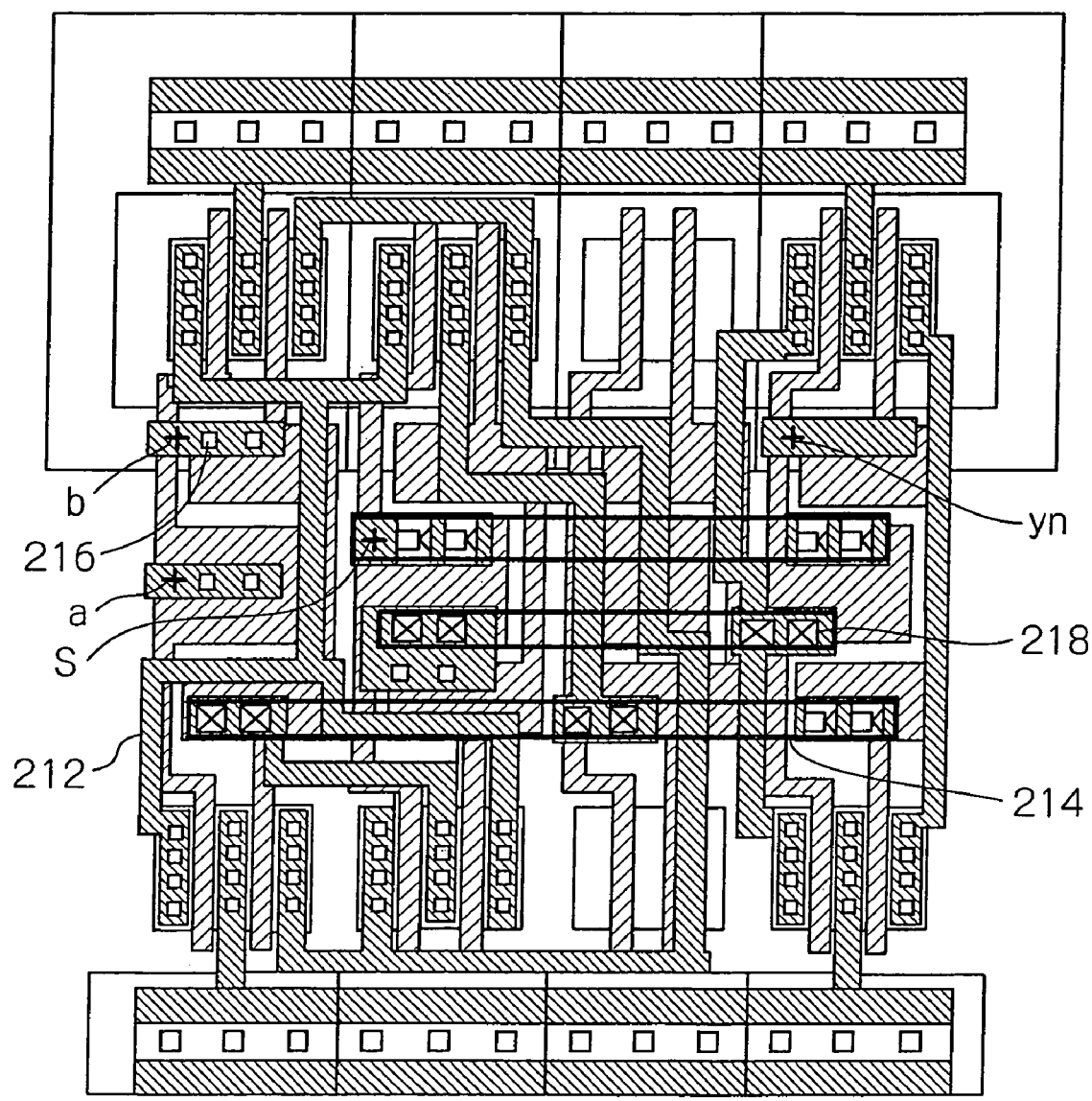
FIG. 5 is a schematic plan view, like FIG. 2, showing a multiplexer which is implemented by applying the basic layer of the unit cell shown in FIG. 4.
Figure 6:
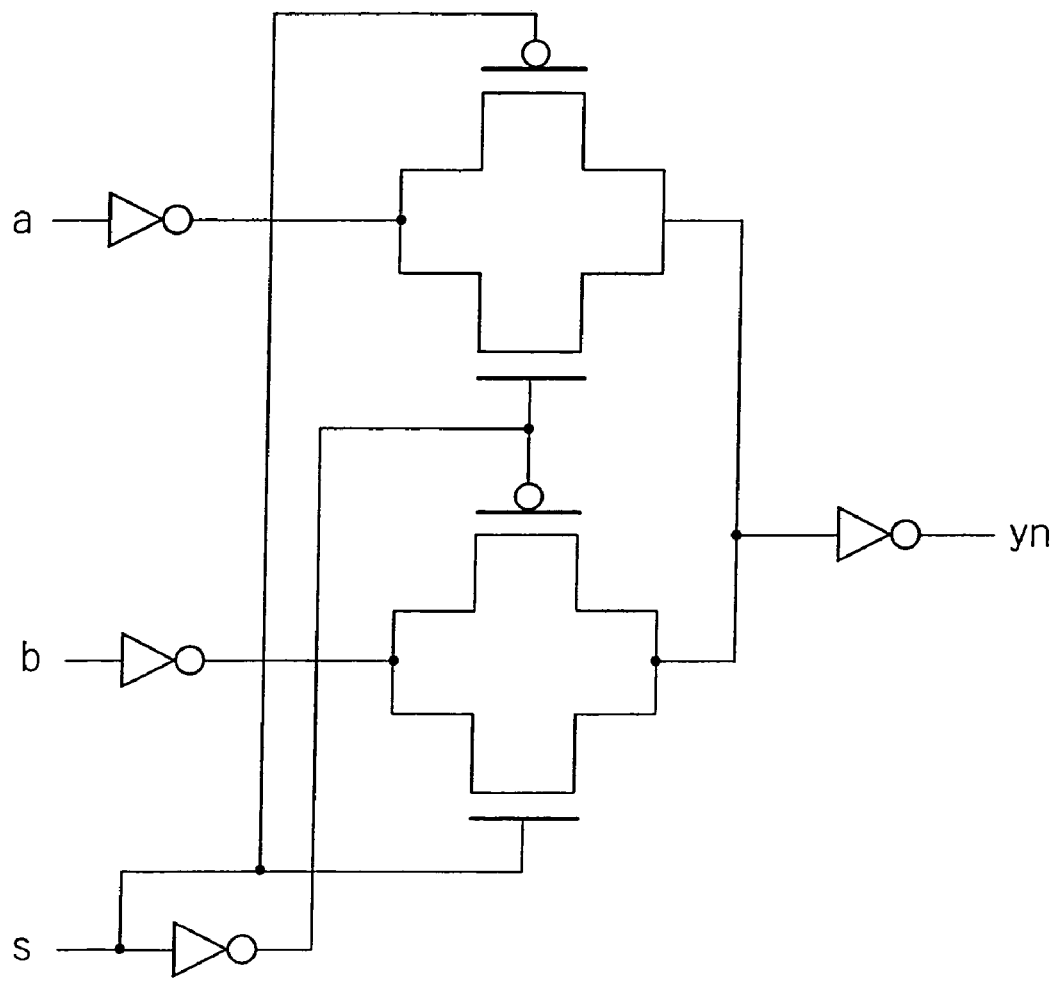
FIG. 6 is a schematic circuit diagram, like FIG. 3, of the multiplexer shown in FIG. 5.

The gate array of this embodiment has the basic layer of the unit cell 200 laid over, as shown in FIG. 5, with a strip 212 of the first metal layer, a strip 214 of the second metal layer, and an upper wiring layer of contact pads 216 and through-holes 218 to implement, for example, a dual-input single-output multiplexer 210. The multiplexer 210 may be of the type schematically shown in a circuit diagram of FIG. 6.

In the multiplexer 210, the strip 212 of the first metal layer is arranged in connection by means of the contact pads 216, and the strip 214 of the second metal layer is arranged in connection by means of the through-holes 218. The strip 214 of the second metal layer is arranged to joint the unit cell 200 by means of the through-holes 218 located in the gate terminal regions 206. The gate terminal regions 206 extending laterally also allows each gate terminal region 206 to include plural contact pads 216.

Figure 7:
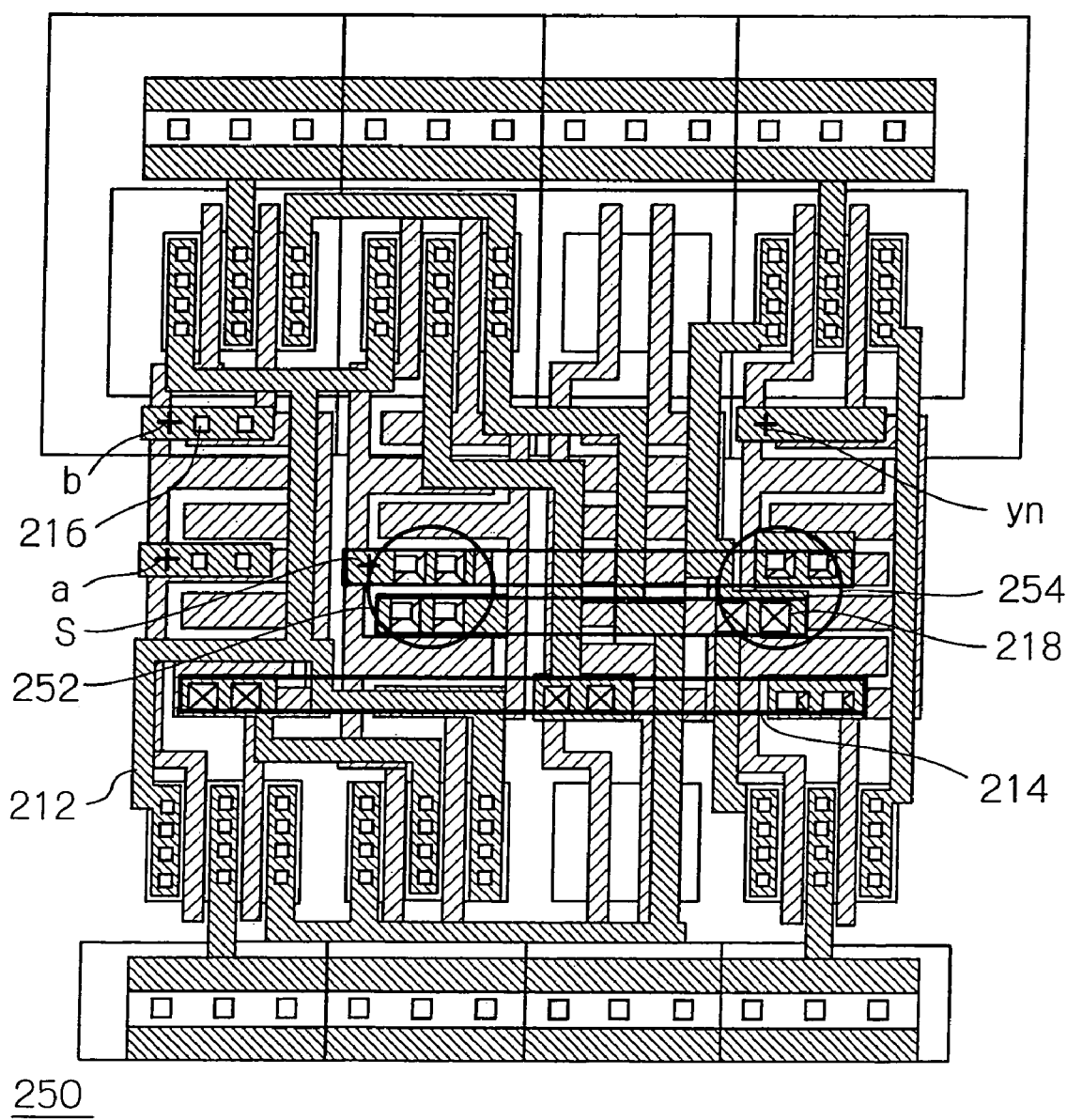
FIG. 7 is a schematic plan view, like FIG. 2, showing a multiplexer which would be implemented by applying the basic layer of the unit cell shown in FIG. 1.

When designing a gate array, such as a multiplexer, in which unit cells are connected via the second metal layer, the use of the unit cell 10 whose gate terminal regions are extended only laterally as shown in FIG. 1 would result in a multiplexer 250 having its structure as shown in FIG. 7.

In this case, specifically, the unit cell 10 has the laterally elongate gate terminal regions 34 of poly-silicon strips 16 and 18 arranged alternately with respect to grid in the longitudinal direction of the strips. That would render the multiplexer 250 have the strips 214 of the second metal layer closely adjacent to each other in the vertical direction in the figure. Adjacent in the vertical direction to one place where the strip 212 of the first metal layer switches to the strip 214 of the second metal layer, another place may often have to be provided where a strip 212 of the first metal layer 212 switches to a strip 214 of the second metal layer. In that case, the first metal layer overlapping with respect to the through-holes 218 may be so marginal as to violate the design rule.

Figure 8:
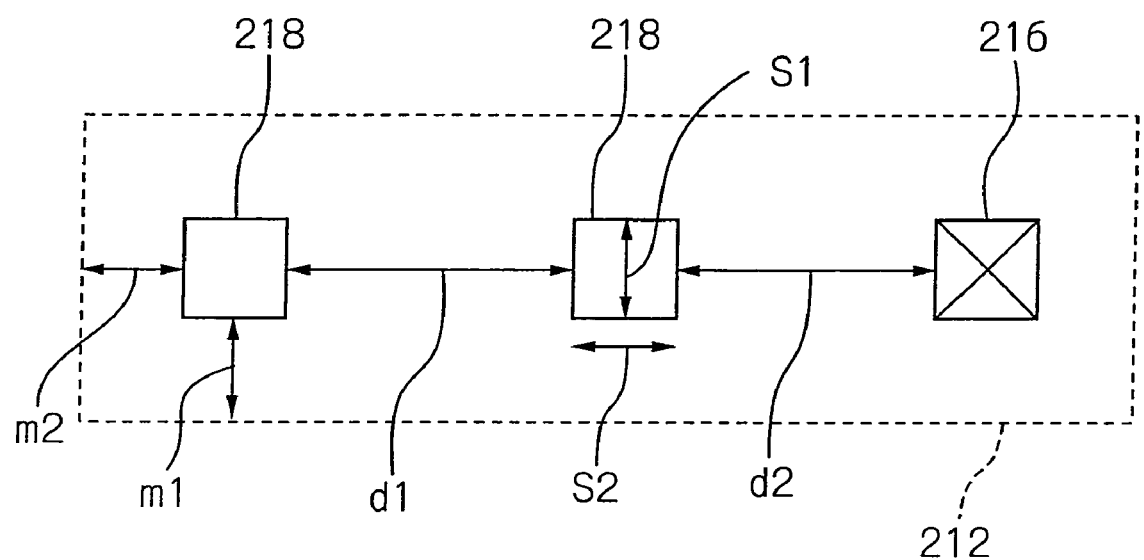
FIG. 8 schematically shows an example of the marginal overlapping of the strip of a first metal layer caused by the multiplexer shown in FIG. 7.

For example, as shown in FIG. 8, the strip 212 of the first metal layer has the two through-holes 218 arranged whose length S1 is 0.3 mm (millimeter) and width S2 is 0.3 mm with the distance d1 between the through-holes 218 defined to be 0.35 mm without defining the distance d2 to the contact pad 216 from the adjacent through-hole. In this case, as a marginal rule for the overlapping of the first metal layer, the through-holes 218 may be defined with the distance m1 to the upper or lower edge of the strip 212 of the first metal layer at least 0.15 mm and the distance m2 to the right or left edge of the strip 212 at least 0.20 mm.

The multiplexer 250, FIG. 7, involves two areas 252 and 254 in which the aforementioned design rule is violated. In order to implement the multiplexer 250 on the basis of the unit cell 10 without violating the design rule, the arrangement of the second metal layer would require the provision of an increased number of the gate terminal regions, thus causing the size of the unit cell to increase.

Figure 4:
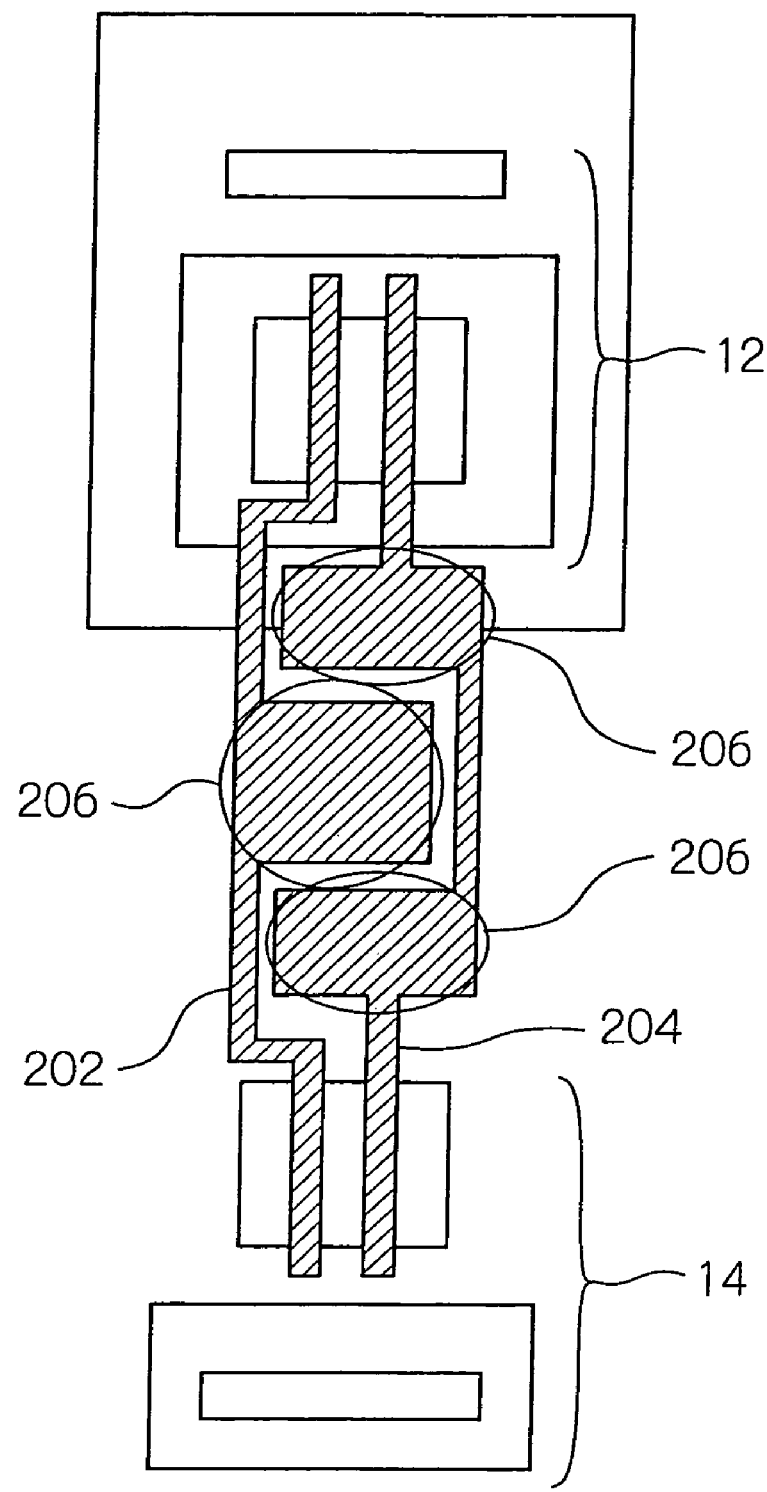
FIG. 4 is a schematic plan view, like FIG. 1, showing an alternative embodiment of the basic layer of the unit cell contained in the gate array according to the invention.

By contrast, according to the gate array of the embodiment based upon the unit cell 200 shown in FIG. 4, the unit cell 200 has the gate terminal regions 206 of the poly-silicon strips 202 and 204 extending also in the longitudinal direction, as described above. The multiplexer 210 as shown in FIG. 5 can be implemented to have the strip 214 of the second metal layer spaced in correspondence with one grid, thus avoiding the violation against the design rule.

With the gate array of the embodiment, the unit cell 200 is applied in which the gate terminal regions 206 are thus extended both in the lateral and longitudinal directions with respect to the poly-silicon strips 202 and 204. It is therefore possible to increase design freedom for locations not only in the lateral direction of the input terminals a and b, the control signal terminal s, the output terminal yn, the contact pads 216 and the through-holes 218, but also in the longitudinal direction of the contact pads 216 and the through-holes 218, so as to arrange the strips 212 and 214 of the first and second metal layers at the optimum positions. In addition, it is also possible to increase design freedom for locations in the longitudinal direction of the input terminals a and b, the control signal terminal s and the output terminal yn.

In the gate array of the embodiment, the gate terminal regions 206 extending laterally and longitudinally increases design freedom for the locations of parts and elements to avoid violating the design rule. It is unnecessary to expand the cell size only to obey the design rule.

Figure 9:
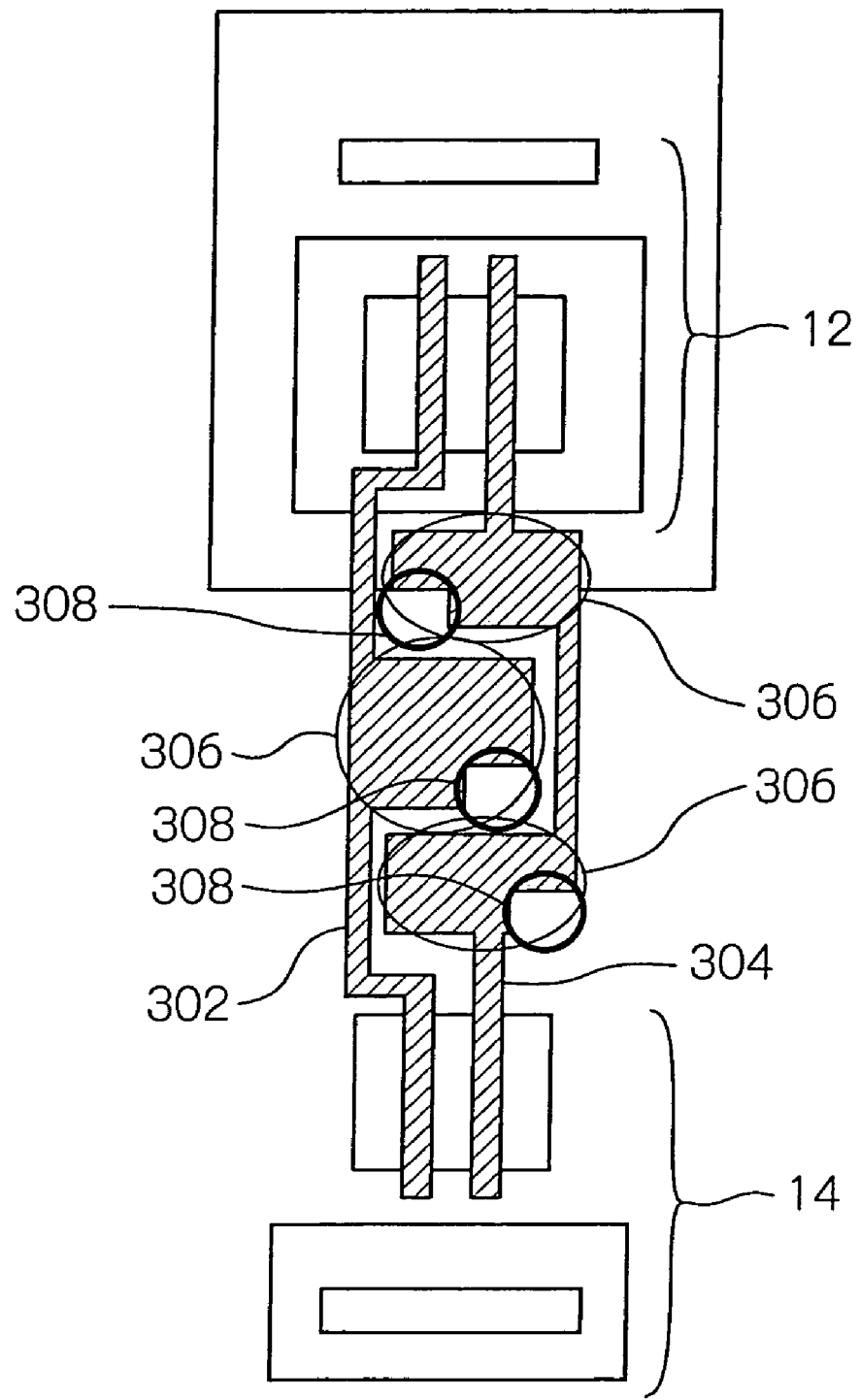
FIG. 9 is a schematic plan view, like FIG. 1, showing another alternative embodiment of the basic layer of the unit cell contained in the gate array according to the invention.

Next, a still alternative embodiment of the gate array will be described according to the invention. In the basic layer of a unit cell 300 shown in FIG. 9, the poly-silicon strips 302 and 304 are provided with gate terminal regions 306 extending laterally and vertically in the figure, the regions 306 particularly having notches 308 cut as illustrated in the figure.

Figure 10:
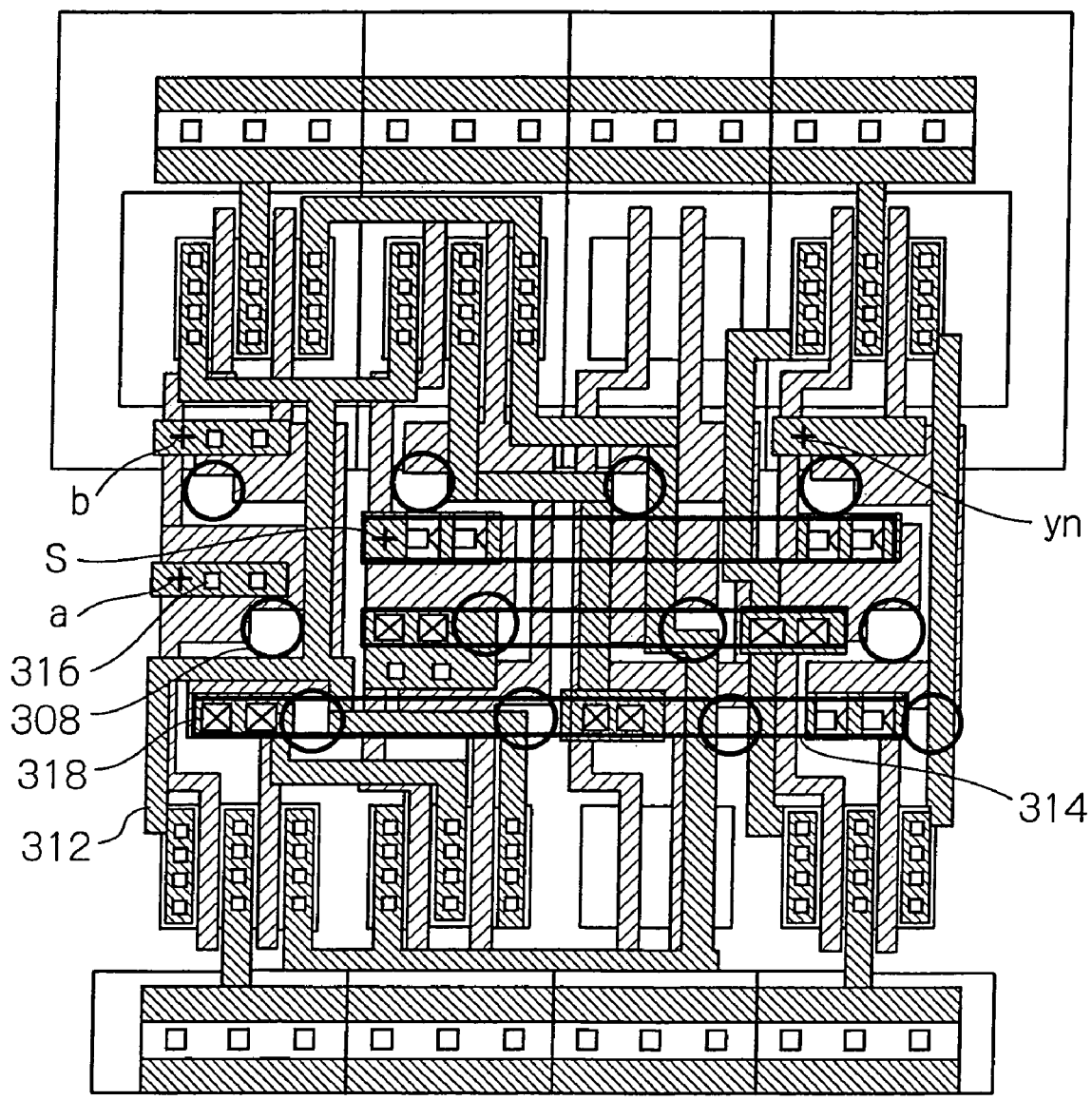
FIG. 10 is a schematic plan view, like FIG. 2, showing a multiplexer which is implemented by applying the basic layer of the unit cell shown in FIG. 9.
Figure 11:
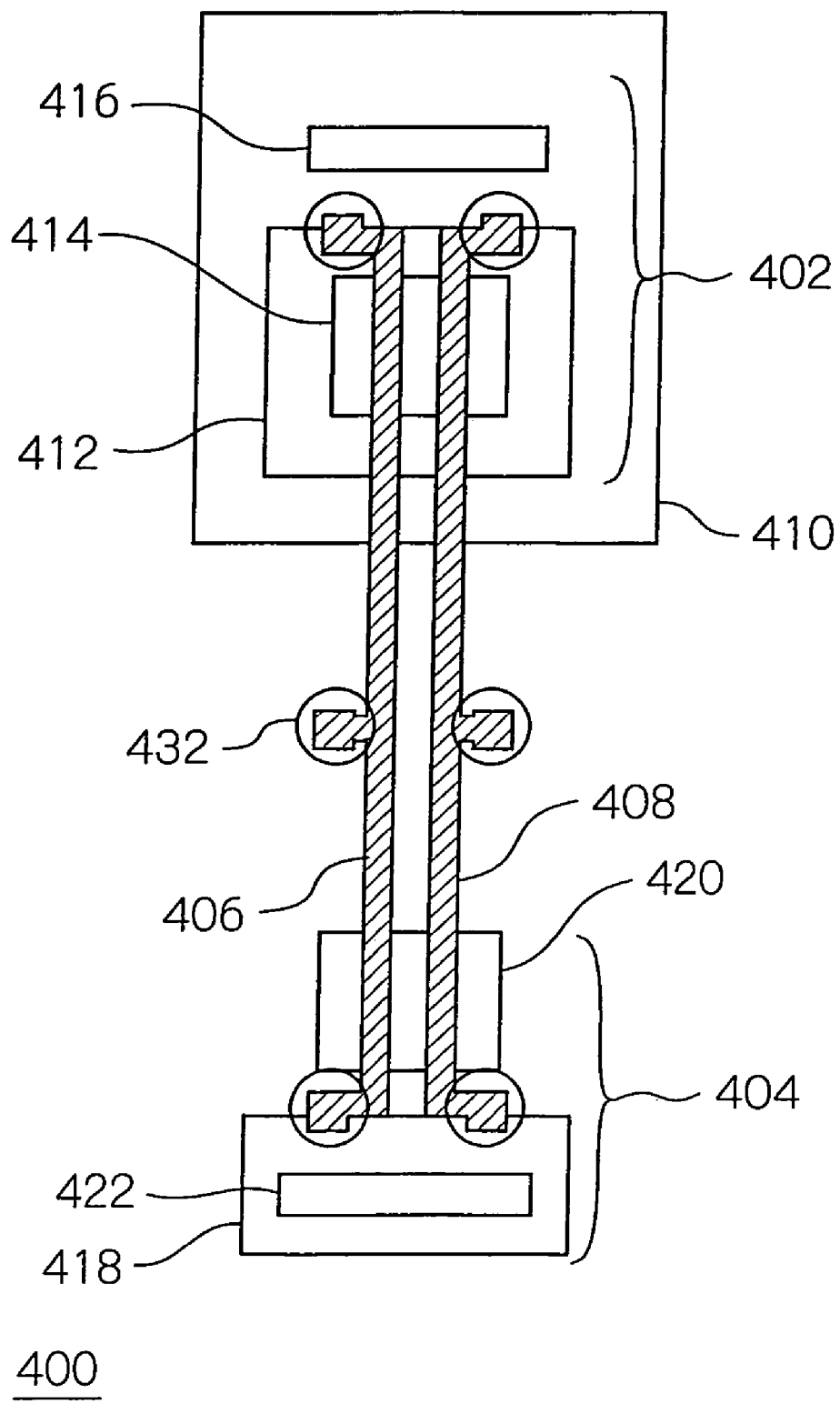
FIG. 11 is a schematic plan view, like FIG. 1, showing the basic layer of the unit cell contained in the conventional gate array.
Figure 12:
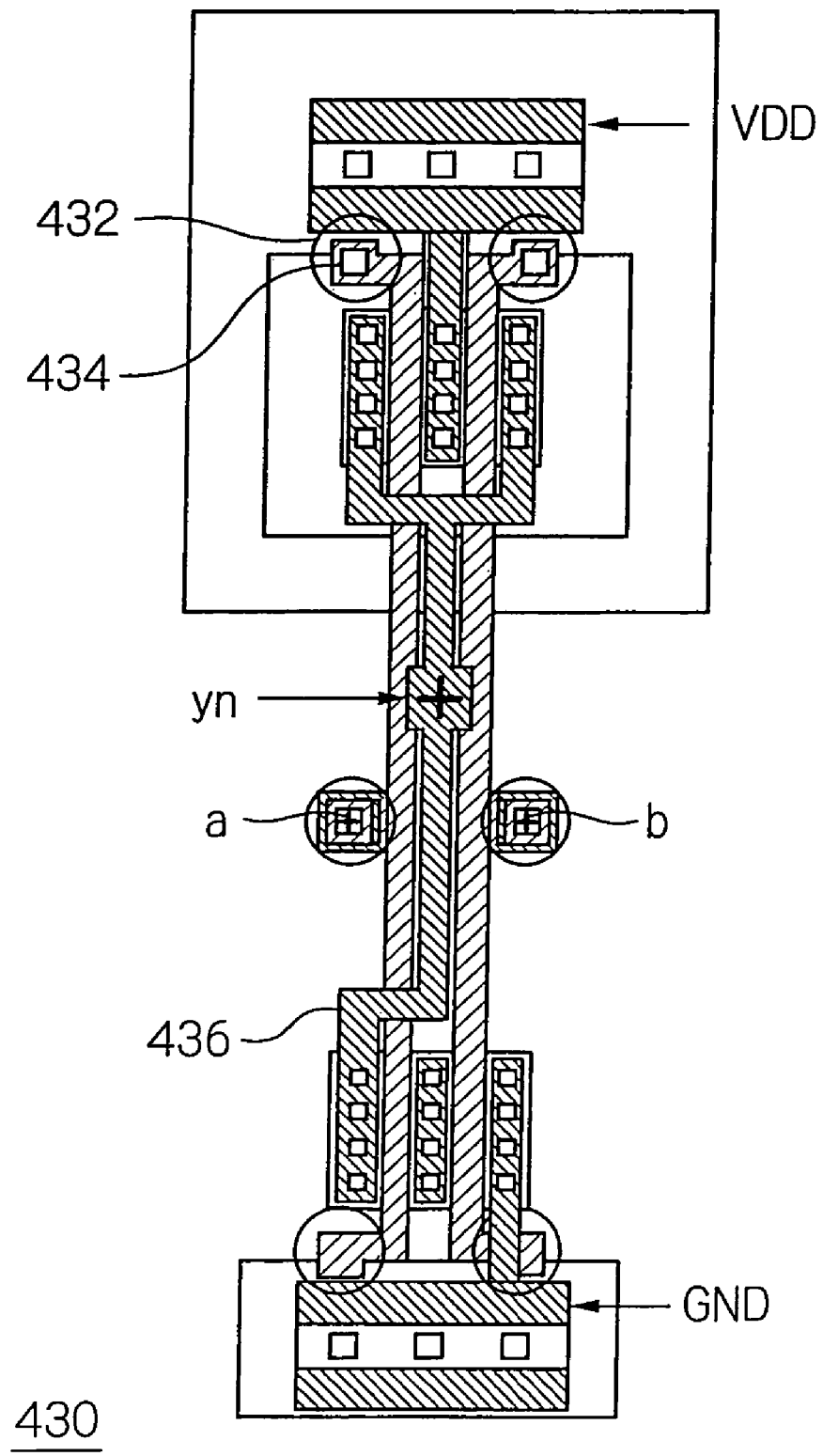
FIG. 12 is a schematic plan view, like FIG. 2, showing a NAND gate circuit which is implemented by applying the basic layer of the conventional unit cell shown in FIG. 11.

For example, a dual-input single-output multiplexer 310 shown in FIG. 10 has some areas which have neither contact pad nor through-hole, such as 316 or 318, disposed within the gate terminal regions 306 between a plurality of unit cells 300. The unit cells 300 of the embodiment have the notches or cutoffs 308 provided at the areas including neither contact pads nor through-holes to thereby reduce the space occupied by the gate terminal regions 306. The fewer the unit cells required to constitute basic functional cells, the more the notches 308 of the gate terminal regions 306.

In the gate array according to the invention, the more the notches 308 in the gate terminal regions 306, the smaller the wiring area of the poly-silicon strips 302 and 304. When the area of poly-silicon strips 302 and 304 is reduced, their capacitance are also reduced, thus improving the processing rate and reducing the power consumption in the gate array integrated circuit.

The entire disclosure of Japanese patent application No. 2004-271662 filed on Sep. 17, 2004, including the specification, claims, accompanying drawings and abstract of the disclosure is incorporated herein by reference in its entirety.

While the present invention has been described with reference to the particular illustrative embodiments, it is not to be restricted by the embodiments. It is to be appreciated that those skilled in the art can change or modify the embodiments without departing from the scope and spirit of the present invention.

What is claimed is:

1. A gate array integrated circuit comprising at least one unit cell, said at least one unit cell further comprising:
    a PMOS transistor and an NMOS transistor each comprising a respective active region thereof, the active regions defining a longitudinal direction extending between them and defining a field region disposed between them, the field region excluding the active region of said PMOS transistor and said NMOS transistor;
    a poly-silicon layer including a plurality of longitudinal portions of said poly-silicon layer being arranged in parallel to each other in the longitudinal direction to bridge between active regions of said PMOS transistor and said NMOS transistor,
    said longitudinal portions including a plurality of gate terminal regions each having an elongated share and extending in a lateral direction that is substantially perpendicular to longitudinal direction, each of the gate terminal regions having a space sufficient to dispose a plurality of connections thereon arrayed in the lateral direction; and
    a plurality of connecting parts in the space on at least one of the gate terminal regions.

2. The gate array integrated circuit in accordance with claim 1, wherein each of said longitudinal portions includes a respective plurality of gate terminal regions and said plurality of gate terminal regions are arranged in a comb-like shape.

3. The gate array integrated circuit in accordance with claim 2, wherein said plurality of gate terminal regions are arranged in a comb-like shape having teeth alternately interposed between said two longitudinal portions.

4. The gate array integrated circuit in accordance with claim 1, wherein said plurality of gate terminal regions are additionally elongated in a longitudinal direction substantially perpendicular to the lateral direction to allow said plurality of connecting parts to additionally be disposed in the longitudinal direction.

5. The gate array integrated circuit in accordance with claim 4, wherein said plurality of gate terminal regions have a notch formed at a notch portion not to be used in common to said at least one unit cell.

6. The gate array integrated circuit in accordance with claim 1, wherein the connecting part is a contact pad.

7. The gate array integrated circuit in accordance with claim 1, wherein the connecting part is a through-hole.

8. The gate array integrated circuit in accordance with claim 1, wherein the wiring terminal comprises an input terminal or an output terminal.

9. A layout method of designing a gate array integrated circuit including at least one unit cell, said method comprising:
    providing said at least one unit cell with a PMOS transistor and an NMOS transistor, each comprising a respective active region thereof, the active regions defining a longitudinal direction extending between them and defining a field region disposed between them, the field region excluding the active region of said PMOS transistor and said NMOS transistor;
    providing a poly-silicon layer including a plurality of longitudinal portions of said poly-silicon layer arranged in parallel to each other in the longitudinal direction to bridge between active regions of the PMOS transistor and the NMOS transistor,
    said longitudinal portions including a plurality of gate terminal regions each having an elongated shape and extending in a lateral direction that is substantially perpendicular to the longitudinal direction, each of the gate terminal regions having a space sufficient to dispose a plurality of connections thereon arrayed in the lateral direction; and
    providing a plurality of connecting parts in the space on at least one of the gate terminal regions.

10. The method in accordance with claim 9, wherein each of said longitudinal portions includes a respective plurality of gate terminal regions and said plurality of gate terminal regions are arranged in a comb-like shape. defined as passing the PMOS transistor and the NMOS transistor.

11. The layout method in accordance with claim 9, comprising arranging said plurality of gate terminal regions in a comb-like shape having teeth alternately interposed between said two portions.

12. The layout method in accordance with claim 9, comprising additionally elongating said plurality of gate terminal regions in a longitudinal direction substantially perpendicular to the lateral direction to allow the plurality of connecting parts to additionally be arranged in the longitudinal direction.

13. The layout method in accordance with claim 12, comprising forming a notch at a portion of said plurality of gate terminal regions not to be used in common to said at least one unit cell.

14. The method in accordance with claim 9, wherein the connecting part is a contact pad.

15. The method in accordance with claim 9, wherein the connecting part is a through-hole.

16. The method in accordance with claim 9, wherein the wiring terminal comprises an input terminal or an output terminal.

* * * * *